US010911064B1

(12) United States Patent
Xie et al.

(10) Patent No.: US 10,911,064 B1
(45) Date of Patent: Feb. 2, 2021

(54) SYMBOL PAIR ENCODING FOR DATA COMPRESSION

(71) Applicant: Seagate Technology LLC, Cupertino, CA (US)

(72) Inventors: Hongmei Xie, Milpitas, CA (US); Erich Franz Haratsch, San Jose, CA (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/734,904

(22) Filed: Jan. 6, 2020

(51) Int. Cl.
*H03M 7/42* (2006.01)
*H03M 7/30* (2006.01)
*H03M 7/40* (2006.01)

(52) U.S. Cl.
CPC ........... *H03M 7/42* (2013.01); *H03M 7/3095* (2013.01); *H03M 7/4093* (2013.01); *H03M 7/6011* (2013.01)

(58) Field of Classification Search
CPC .... H03M 7/42; H03M 7/3095; H03M 7/4093; H03M 7/6011
USPC .................................. 341/50–51, 65, 67, 87
See application file for complete search history.

(56) References Cited

U.S. PATENT DOCUMENTS

| 5,532,693 | A | 7/1996 | Winters et al. |
| 7,233,266 | B2 * | 6/2007 | Sasakura ............. H03M 7/3084 341/106 |
| 8,542,135 | B2 * | 9/2013 | Golander ............ H03M 7/3086 341/51 |
| 9,264,068 | B2 * | 2/2016 | Wu ...................... H03M 7/3095 |
| 9,825,649 | B1 * | 11/2017 | Satpathy ............. H03M 7/3086 |

OTHER PUBLICATIONS

Huffman, David A.; Article entitled: "A Method for the Construction of Minimum-Redundancy Codes", Proceedings of the IRE, Sep. 1952, 4 pgs.
Salomon, David; "LZMA and 7-Zip", Data Compression: The Complete Reference, Fourth Edition, 2007, pp. 241-246, 6 pgs.
Ziv, et al; Article entitled: "A Universal Algorithm for Sequential Data Compression", IEEE Transactions on Information Theory, vol. IT-23, No. 3, May 1977, 7 pgs.
Ziv, et al; Article entitled: "Compression of Individual Sequences via Variable-Rate Coding", IEEE Transactions of Information Theory, vol. IT-24, No. 5, Sep. 1978, 7 pgs.

* cited by examiner

*Primary Examiner* — Khai M Nguyen (74) *Attorney, Agent, or Firm* — Taylor English Duma LLP (57) ABSTRACT

Methods, apparatuses, and computer-readable media for compressing data for storage or transmission. Input data is compressed in a first stage utilizing a first compression algorithm and the frequencies of occurrence of symbols and symbol pairs in the output from the first stage is calculated. The output from the first stage is then encoded to a final compressed bit string in a second stage utilizing a second compression algorithm based on the calculated frequencies of occurrence of the symbols and the symbol pairs.

18 Claims, 6 Drawing Sheets

SYMBOL PAIR ENCODING FOR DATA COMPRESSION

BRIEF SUMMARY

The present disclosure relates to technologies for compressing data for storage or transmission. According to some embodiments, a method for compressing data comprises compressing the data in a first stage utilizing a first compression algorithm and then calculating frequencies of occurrence of symbols and symbol pairs in an output from the first stage. The output from the first stage is then encoded to a final compressed bit string in a second stage utilizing a second compression algorithm based on the calculated frequencies of occurrence of the symbols and the symbol pairs.

According to further embodiments, a storage device comprises a storage media and a controller coupled to the storage media. The controller is operable to receive data to be written to the storage media and compress the data in a first stage utilizing a first compression algorithm. The controller then calculates statistics regarding the frequencies of occurrence of symbols and symbol pairs in the output from the first stage and identifies symbols and symbol pairs to be encoded in a final compressed bit string in a second stage. The controller encodes the identified symbols and symbol pairs in the final compressed bit string in the second stage utilizing a second compression algorithm that differs from the first compression algorithm based on the calculated statistics regarding the frequencies of occurrence of the symbols and the symbol pairs.

According to further embodiments, a computer-readable medium has processor-executable instructions stored thereon that, when executed by a CPU of a controller of a storage device, cause the controller to compress input data in a first stage utilizing a first compression algorithm. Statistics the regarding frequencies of occurrence of symbols and symbol pairs in the output from the first stage are calculated and symbols and symbol pairs to be encoded in a final compressed bit string in a second stage are identified. The controller encodes the identified symbols and symbol pairs in the final compressed bit string in the second stage utilizing a second compression algorithm based on the calculated statistics regarding the frequencies of occurrence of the symbols and the symbol pairs.

These and other features and aspects of the various embodiments will become apparent upon reading the following Detailed Description and reviewing the accompanying drawings.

BRIEF DESCRIPTION OF THE DRAWINGS

In the following Detailed Description, references are made to the accompanying drawings that form a part hereof, and that show, by way of illustration, specific embodiments or examples. The drawings herein are not drawn to scale. Like numerals represent like elements throughout the several figures.

DETAILED DESCRIPTION

The following detailed description is directed to technologies for compressing data for storage or transmission. Compression reduces redundancy contained in data frames saving storage space and/or improving data transmission bandwidth. In flash-based storage devices, such as a NAND flash solid state drive ("SSD"), compressing data before storing it may also reduce write amplification, improve I/O throughput, and extend the lifespan of the device. The efficiency of a compression algorithm can be measured by compression ratio, defined as the following:

$$\text{Compression Ratio} = 1 - \frac{\text{size of output data frame}}{\text{size of input data frame}}$$

Hence the higher the compression ratio, the more space that can be saved in the storage device and the lower write amplification that will be realized.

Among the most widely used lossless data compression algorithms are the Lempel-Ziv ("LZ") variants, such as LZ77 and LZSS. The LZ compression algorithms remove redundancies from the input data, such as repeated strings of symbols, by substituting offset/length pairs for the repeated strings in the output stream that indicate the position and length of the previous appearance of the repeated string. In some LZ algorithms, such as LZSS, a flag may also be inserted into the output stream to distinguish literals from offset/length pairs. All of the different categories or types of output symbols from an LZ encoder, including literals, flags, offsets, and lengths, are referred to herein as LZ symbols, with each symbol belonging to particular type. For example, an ASCII character 'A' in the output stream would belong to the literal type, a length value of 4 from an offset/length pair would belong to the length type, and so on.

Another type of lossless data compression is Huffman coding. The Huffman algorithm involves building a variable-length code table derived from an estimated probability or frequency of occurrence (weight) of each possible value of input symbol, with more common symbols represented using fewer bits than less common symbols. The code table is then utilized to encode the input data. However, Huffman coding is primarily optimal for symbol-by-symbol encoding and may not compress input data containing many redundant strings of symbols very well.

Figure 1:
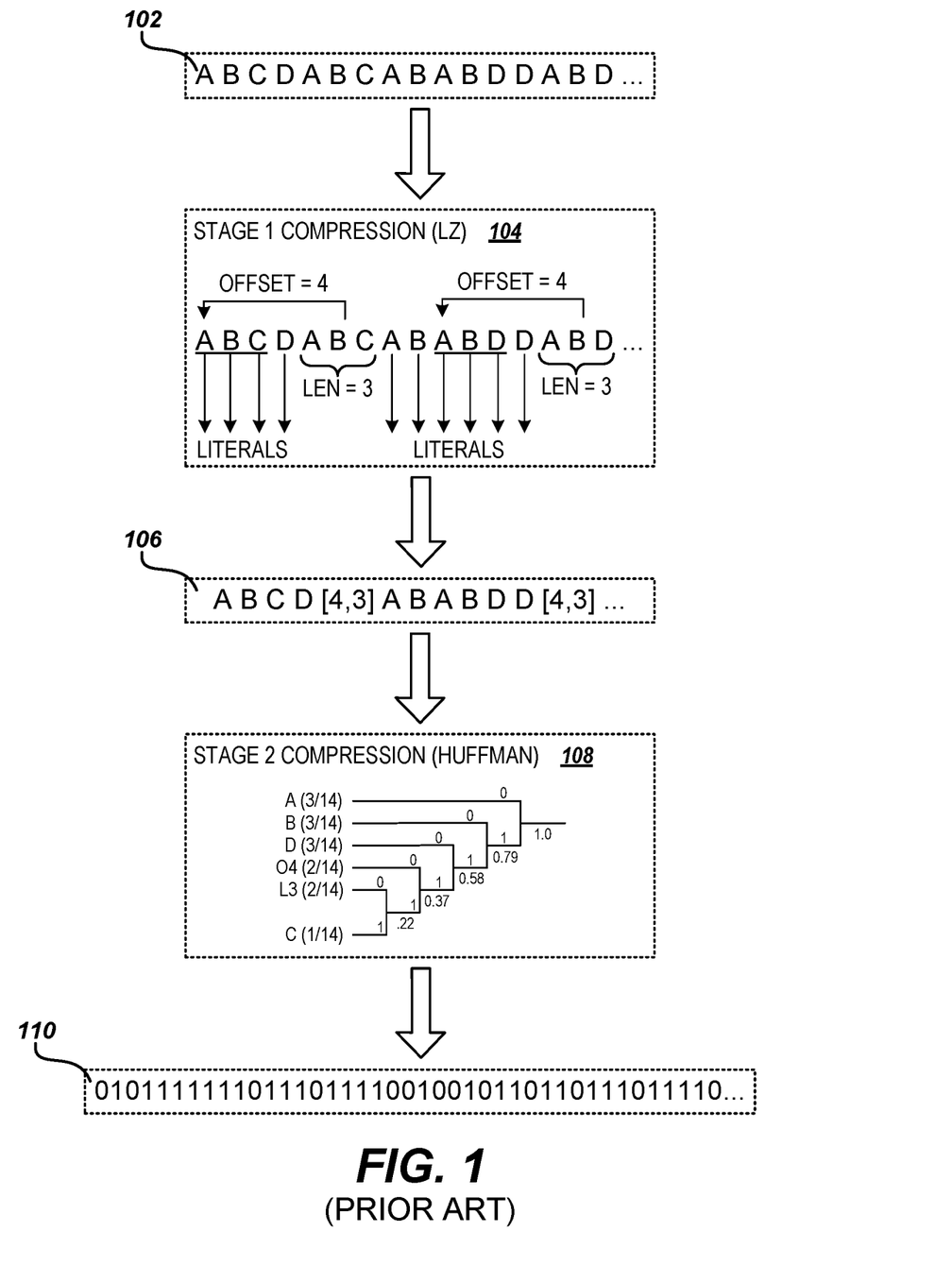
FIG. 1 is a diagram showing details of conventional two-stage compression techniques.

Some lossless data compression algorithms use a two-stage approach, such as an LZ encoder in the first stage and Huffman coding in the second. Output symbols from the first stage, such as literals, match length, and offsets, are encoded individually and independently in the second stage. For example, as shown in FIG. 1, input data 102 of "ABCD-ABCABABDDABD . . . " may be compressed with an LZ encoder, such as LZSS, in a first stage, with the redundant symbols of "ABC" and "ABD" replaced with offset/length pairs as shown at 104. The stage 1 compression 104 results in first stage output 106 comprising three types of LZ symbols: literals (e.g., "A", "B", "C", and "D"), lengths (e.g., L3), and offsets (e.g., O4).

In a stage 2 compression 108, the frequency of occurrence of each LZ symbol in the first stage output 106 is used to build a Huffman code table for the encoding the final compressed bit string 110. For example, the literal "D" has a frequency of occurrence of 3 out of 14 symbols (0.214) in the first stage output 106 and is represented by the bit string of "110" and the length value "L3" has a frequency of occurrence of 2 out of 14 symbols (0.143) and is represented by the bit string "11110," as further shown in FIG. 1.

Traditionally, encoding in the stage 2 compression 108 of such two-stage algorithms adopts a single-symbol approach, as it assumes inter-symbol redundancies were removed in the stage 1 compression 104. However, it may not generally be possible to completely remove all inter-symbol dependencies or redundancies in the stage 1 compression 104. For example, LZSS encoders normally include some minimum-match length before offset/length pairs will be substituted for literal strings, such as a minimum-match length of at least 3. This prevents the substitution from resulting in more LZ symbols in the output than simply reproducing the literals of the string outright. Additionally, redundancies may be introduced by repeated offset/length pairs.

According to embodiments described herein, a two-stage compression algorithm may be implemented that removes most redundancies in the first stage of compression while still compensating for remaining redundancies in the second stage of compression. This may be accomplished by encoding redundant symbols pairs, in addition to individual symbols, in the second stage, where the symbol pairs are composed of LZ symbols of the same type or from different types. For example, redundant symbol pairs may be composed of two literals, an offset/length pair, a literal and an offset, a length and a literal, a flag and an offset, and the like. Those symbol pairs having a frequency of occurrence exceeding some threshold value, e.g., 2 out of N symbols in the encoding window, may be encoded as a pair while remaining symbols are encoded individually. In addition, the frequency of occurrence of symbols may be calculated in real-time from the output of the first stage of compression or may be predetermined based on common input data to the device or process. According to simulations done for storage devices, specifically SSD devices, utilizing encoding of redundant literal pairs results in an additional compression efficiency gain in the data compression process.

Figure 2:
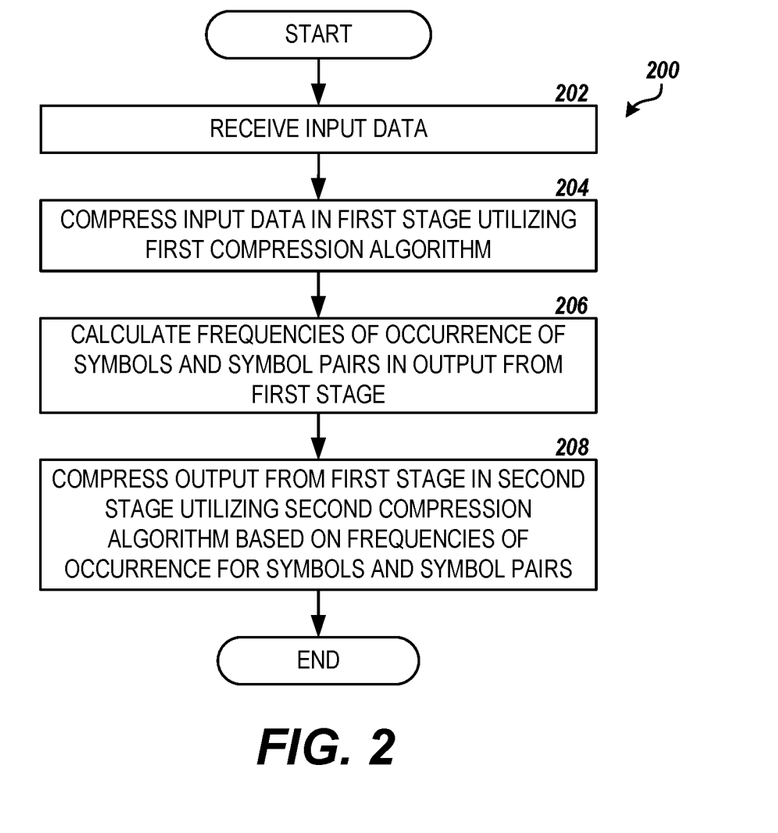
FIG. 2 is a flow diagram showing one routine for compressing input data utilizing a two-stage compression algorithm, according to embodiments described herein.

FIG. 2 illustrates one routine 200 for compressing data for storage or transmission, according to the embodiments described herein. According to some embodiments, the routine 200 may be performed by a controller of an SSD or other storage device. In other embodiments, the routine 200 may be performed by a data processor prior to transmission of the data over a communication channel. The routine 200 includes step 202, where input data is received. For example, data to be written to the storage media may be received from a host connected to the storage device. Next, as step 204, the input data is compressed in a first stage. According to some embodiments, the first stage compression may utilize an LZ encoder, such as LZSS. The output from the first stage compression may include symbols of various types, including literals, offsets, lengths, and flags.

From step 204, the routine 200 proceeds to step 206, where the output from the first stage compression is statistically analyzed to calculate the frequencies of occurrence of symbols and symbol pairs in the output. In some embodiments, the frequencies of occurrence of pairs of specific types of LZ symbols may be calculated, such as literal pairs and offset/length pairs. In further embodiments, the frequencies of occurrence of pairs of literal and offset symbols, literal and flag symbols, flag and offset symbols, length and flag symbols, or any combination of these and other pairs of symbols may be calculated.

The routine 200 then proceeds from step 206 to step 208, where the output from the first stage compression is compressed in a second stage of compression utilizing the calculated frequencies of occurrence of symbols and symbol pairs from step 206. According to some embodiments, the second stage compression may utilize a Huffman coding derived from the calculated frequencies of occurrence of symbols and symbol pairs in the output data. For example, pairs of literal symbols repeating more than a threshold number of times may be treated as a "super symbol" in building the Huffman code table, with the remaining literals treated individually. Offset/length pairs repeating more than a threshold number of times may be treated in a similar fashion. The threshold number of repeated occurrences may be determined from a number of factors, including the number of repeating symbols and symbol pairs, the size of the encoding window in the second stage compression algorithm, the size (maximum number of bits) in the resulting Huffman code table, and the like. In some embodiments, literal pairs and offset/length pairs occurring twice or more may be treated as a single super symbol for building the Huffman code table.

The resulting Huffman code table can then be utilized to encode the output from the first stage compression into the final compressed bit string. According to some embodiments, separate Huffman code tables may be generated in the second stage compression algorithm for pairs of different types of LZ symbols, such as literal pairs, offset/length pairs, and the like, resulting in separate, mutually exclusive codes for encoding the data into the final compressed bit string. From step 208, the routine 200 ends.

Figure 3:
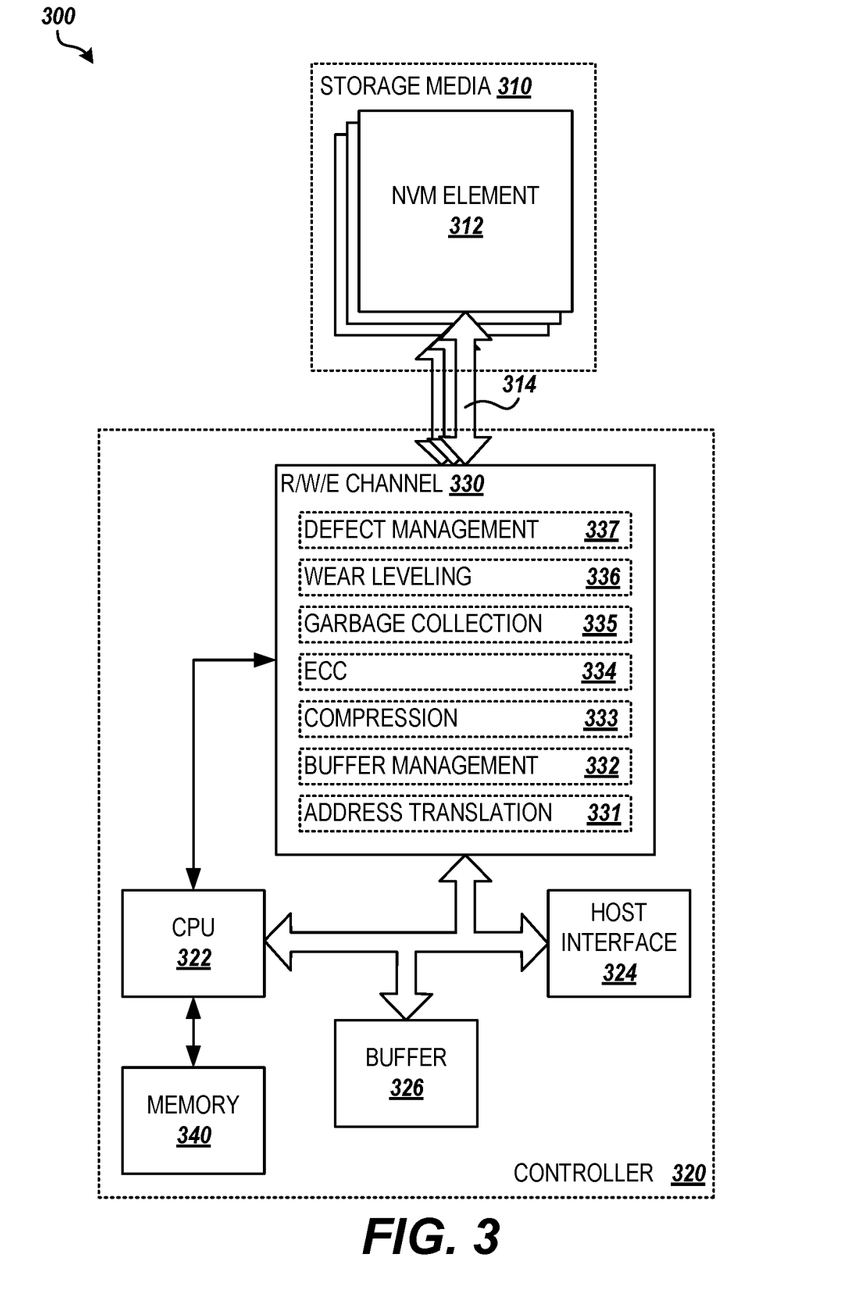
FIG. 3 is a block diagram showing components of an illustrative storage device in which the embodiments described herein may be implemented.

FIG. 3 and the following description are intended to provide a general description of a suitable environment in which the embodiments described herein may be implemented. In particular, FIG. 3 shows an illustrative storage device 300, such as an SSD device, along with hardware, software and components for compressing data in the storage device, according to the embodiments provided herein. The storage device 300 includes a storage media 310. In some embodiments, the storage media 310 may comprise one or more non-volatile memory ("NVM") elements 312. The NVM elements 312 may comprise NAND flash memory dies. In other embodiments, the storage media 310 may comprise NOR flash memory, vertical NAND ("V-NAND") or 3D NAND flash memory, flash memory using polysilicon or silicon nitride technology-based charge storage cells, phase-change memory ("PCM"), racetrack memory, or any other type of solid-state storage media.

The storage device 300 may further comprise a controller 320 that controls the operations of the storage device. According to various embodiments, the controller 320 interfaces with the NVM elements 312 through one or more device interfaces 314. In some embodiments, the device interface(s) 314 comprises of an Open NAND Flash Interface ("ONFI") compatible interface. In further embodiments, the device interface(s) 314 may comprise of one or more of an asynchronous interface; a synchronous interface; a single-data-rate ("SDR") interface; a double-data-rate ("DDR") interface; a toggle-mode compatible flash interface; a non-standard version of any of the preceding interfaces; a custom interface; or any other type of interface used to define the communication with the NVM elements 312.

The device interface(s) 314 may be organized into one or more channels, with each NVM element 312 connected through one of the channels. Each channel may support some number P of NVM elements 312. For example, the device interface(s) 314 may comprise 16 channels, connected to 64 NVM elements 312 organized into four banks. According to embodiments, the controller 320 may be enabled to access NVM elements 312 connected to separate channels concurrently. In further embodiments, the device interface(s) 314 may be organized in one or more groups of channels with one or more of NVM elements 312 per channel, or any other organization of one or more of the NVM elements 312 onto the device interface(s) 314.

The controller 320 may include a central processing unit ("CPU") 322 to monitor and control the operations of the storage device 300. The CPU 322 may represent one or more single-core or multi-core processors known in the art. The controller 320 may further include a host interface 324 allowing the storage device 300 to communicate with one or more host devices or other components (not shown), such as a server computer, personal computer ("PC"), laptop, tablet, game console, set-top box, a storage-area controller, or any other electronics device that can be communicatively coupled to the storage device 300 to store and retrieve data from the storage device. In some embodiments, the controller 320 may be connected to the host device(s) through the host interface 324 via a switch/fabric/intermediate controller (not shown) or some other intermediate device. According to some embodiments, the host interface 324 may be compatible with a Serial ATA ("SATA") interface standard. In further embodiments, the host interface 324 may be compatible with one or more of an IDE interface standard, a SCSI interface standard, a SAS interface standard, a PCIe interface standard, a USB interface standard, a CF interface standard, an MMC interface standard, an SD interface standard, and the like.

The controller 320 may process read and write commands from the host device(s) by formatting the associated data and transferring the formatted data via a read/write/erase channel 330 from and to physical locations on the storage media 310 through the device interface(s) 314. The read/write/erase channel 330 includes the necessary modules and/or circuits to erase, encode, write, read, and decode data from the storage media 310. According to embodiments, the read/write/erase channel 330 includes an address translation module 331 that provides translations between data addressing utilized by the host device(s), e.g., logical bock addresses ("LBAs"), and physical location addressing used by the device interface(s) 314 for the storage media 310, e.g., channel, die, block, and pages in the NVM elements 312.

The read/write/erase channel 330 may further include a buffer management module 332 that manages a buffer 326 for the temporary storage of user data and metadata associated with the NVM elements 312 during various access (read and write) operations, according to some embodiments. For example, the buffer 326 may temporarily store write data pending verify operations upon data being programmed to the NVM elements 312. In some embodiments, the buffer 326 may comprise a local memory, such as static random access memory ("SRAM") or dynamic random access memory ("DRAM") onboard the controller 320. In further embodiments, the buffer 326 may include one or more external SRAM or DRAM memories and/or a buffer area in one or more of the NVM elements 312.

Figure 4:
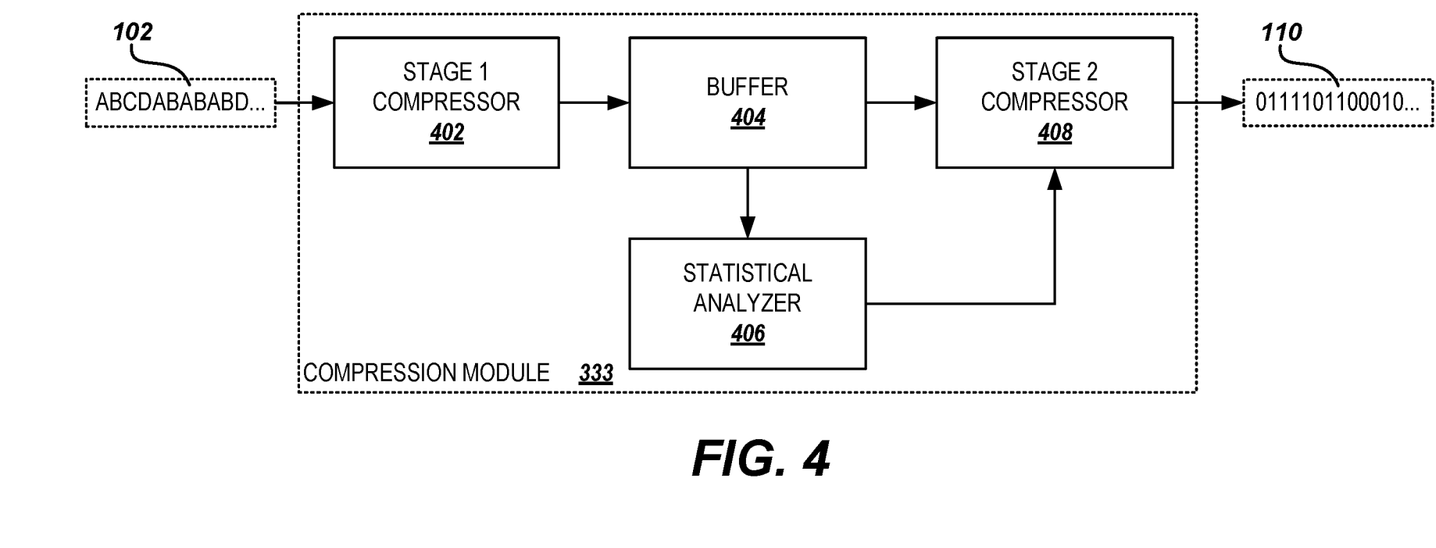
FIG. 4 is a block diagram showing details of a compression module implementing a two-stage compression algorithm, according to embodiments described herein.

The read/write/erase channel 330 further includes a compression module 333 that provides for the compression of write data prior to the data being written to the NVM elements 312 and the decompression of data read from the NVM elements 312 before being passed to the host device(s). According to embodiments, the compression module 333 may contain a two stage compressor, as shown in FIG. 4. The write data (input data 102) from the host device(s) may be compressed through a stage 1 compressor 402 with the output stored temporarily in a buffer 404. In some embodiments, the stage 1 compressor 402 may utilize an LZ algorithm, such as LZ77 or LZSS. The buffer 404 may be located in the buffer 326 or other memory of the controller 320 as described herein.

A statistical analyzer 406 of the compression module 333 may analyze the output from the stage 1 compressor 402 to dynamically determine the frequencies of occurrence of symbols and symbol pairs in the output. In some embodiments, the statistical analyzer 406 may operate on specifically sized data frames of the output data from the stage 1 compressor 403. A stage 2 compressor 408 performs the second stage of compression of the output from the stage 1 compressor 402 read from the buffer 404 to generate the final compressed bit string 110 for writing to the to the NVM elements 312. According to some embodiments, the stage 2 compressor 408 may utilize a Huffman coding algorithm for compression, with the code table(s) derived from the generated statistics from the statistical analyzer 406.

Returning to FIG. 3, in further embodiments, the read/write/erase channel 330 includes an error-correcting code ("ECC") module 334 that provides error correction and/or redundancy functions in the reading or writing of data to and from the NVM elements 312. For example, the ECC module 334 may calculate and write ECC bits along with data programmed to the NVM elements 312. When the data is read back from the NVM elements 312, the ECC module 334 may utilize the ECC bits to correct any read errors. In some embodiments, the ECC algorithms utilized by the ECC module 334 may change from weaker codes gradually moving towards stronger codes as the NVM elements 312 age.

The read/write/erase channel 330 may also include a garbage collection module 335 and a wear-leveling module 336, according to further embodiments. The garbage collection module 335 performs garbage collection by erasing "stale" or no longer used blocks of the NVM elements 312 to make them eligible to be re-written with new data. The garbage collection module 335 may be further enabled to move stored data within or between the NVM elements 312 to make larger contiguous portions of the flash memory available for writing. The wear-leveling module 336 works to ensure program/erase cycles are distributed evenly across all blocks in the NVM elements 312 in order to avoid some prematurely wearing out before other blocks, potentially impacting performance and shortening the lifespan of the storage device 300. For example, wear-leveling module 336 may track a recycle count of each block in the NVM elements 312 in order to allow level use of free blocks for new writes.

In further embodiments, the read/write/erase channel 330 includes a defect management module 337. The defect management module 337 may detect and deal with bad blocks in the NVM elements 312 when the blocks become unusable or unreliable for the storage of data. This may include marking the block as defective and substituting a block from a spare area in the NVM elements 312 for storage of the data in a defective block. It will be appreciated that the defect management module 337, the wear-leveling module 336, the garbage collection module 335, the ECC module 334, the compression module 333, the buffer management module 332, and the address translation module 331 may comprise hardware circuits in the read/write/erase channel 330, processor-executable instructions for execution in the CPU 322, or any combination of these and other components in the controller 320.

The controller 320 may further include a computer-readable storage medium or "memory" 340 for storing processor-executable instructions, data structures, and other information. The memory 340 may comprise a non-volatile memory, such as read-only memory ("ROM") and/or flash memory, and a random-access memory ("RAM"), such as SRAM or DRAM. The memory 340 may further comprise a portion of the non-volatile storage media 310 of the storage device 300. For example, the memory 340 may store a firmware that comprises commands and data necessary for performing the operations of the storage device 300. According to some embodiments, the memory 340 may store processor-executable instructions that, when executed by the CPU 322, perform the routines 200 and 500 for compressing data for storage or transmission, as described herein.

The memory 340 may further store supporting data utilized by the read/write/erase channel 330. According to some embodiments, the memory 340 contains a forward mapping table utilized by the address translation module 331 to lookup physical addresses mapped to LBAs specified in read and write commands. In further embodiments, the memory 340 may be utilized by the compression module 333 to temporarily buffer the output of the stage 1 compressor 402 in the buffer 404, as described above. In further embodiments, the memory 340 may store other information utilized by the modules of the controller 320, such as additional mapping tables utilized by the address translation module 331 and the garbage collection module 335, erase/recycle count tables utilized by the wear-leveling module 336, and defective blocks lists utilized by the defect management module 337, among other information.

In addition to the memory 340, the environment may include other computer-readable media storing program modules, data structures, and other data described herein for compressing data for storage or transmission. It will be appreciated by those skilled in the art that computer-readable media can be any available media that may be accessed by the controller 320 or other computing system for the non-transitory storage of information. Computer-readable media includes volatile and non-volatile, removable and non-removable recording media implemented in any method or technology, including, but not limited to, RAM, ROM, flash memory or other solid-state memory technology, compact disc ROM ("CD-ROM"), digital versatile disk ("DVD"), or other optical storage, magnetic cassettes, magnetic tape, magnetic disk storage or other magnetic storage devices and the like.

It will be appreciated that the structure of the storage device 300 may be different than that illustrated in FIG. 3 and described herein. For example, the CPU 322, read/write/erase channel 330, memory 340, and other components and circuitry of the storage device 300 may be integrated within a common integrated circuit package, such as a system-on-chip ("SoC"), or they may be distributed among multiple integrated circuit packages. Similarly, the illustrated connection pathways are provided for purposes of illustration and not of limitation, and some components and/or interconnections may be omitted for purposes of clarity. It will be further appreciated that the storage device 300 may not include all of the components shown in FIG. 3, may include other components that are not explicitly shown in FIG. 3, or may utilize an architecture completely different than that shown in FIG. 3.

Figure 5:
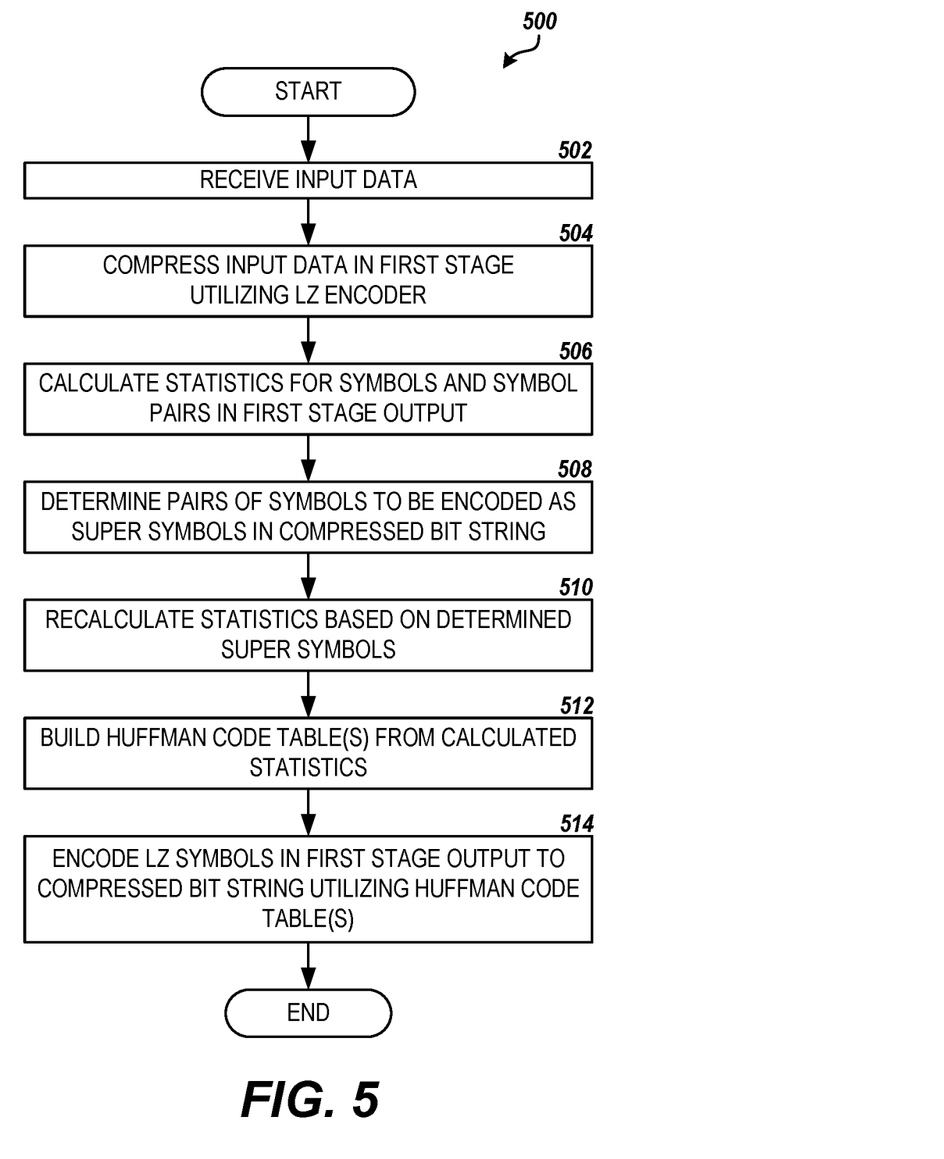
FIG. 5 is a flow diagram showing a routine for compressing input data for storage in a storage device utilizing a two-stage compression algorithm, according to embodiments described herein.

FIG. 5 illustrates one routine 500 for compressing data for storage or transmission, according to the embodiments described herein. According to some embodiments, the routine 500 may be performed by the compression module 333 in the controller 320 of an SSD or other storage device 300. In other embodiments, the routine 500 may be performed by a communication device prior to transmission of data over a communication channel. The routine 500 includes step 502, where input data 102 is received. For example, a write command may be received from a host device through the host interface 324 of the controller 320 containing data to be written to the storage media 310 of the storage device 300.

Figure 6:
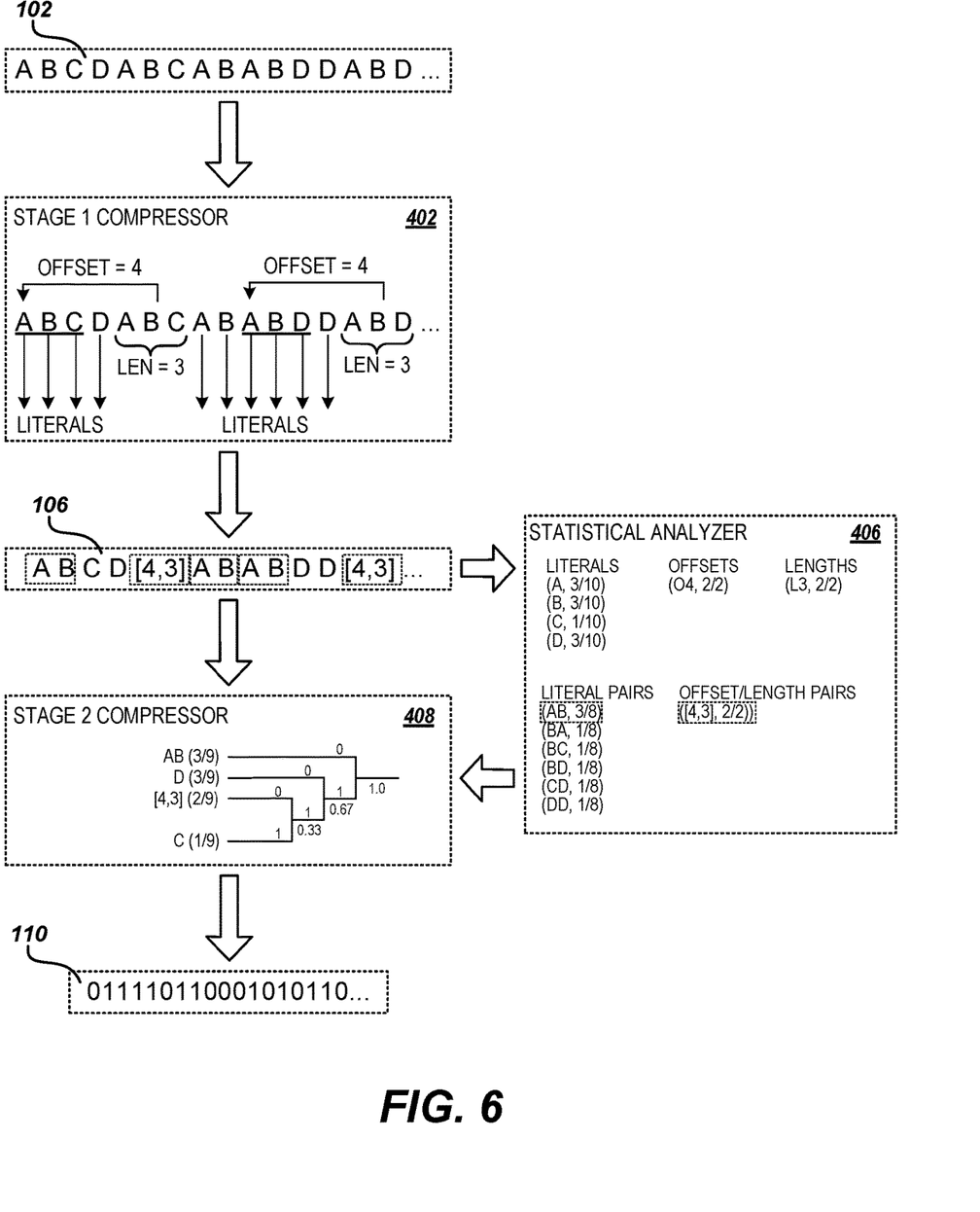
FIG. 6 is a diagram showing details of a novel two-stage compression technique, according to embodiments described herein.

Next, the routine 500 proceeds from step 502 to step 504, where the input data 102 is compressed in a first stage by an LZ encoder, such as LZSS. According to some embodiments, the input data 102 may be compressed by the stage 1 compressor 402 of the compression module 333, as shown in FIG. 6. The first stage output 106 may include various types of LZ symbols, such as literals, offsets, lengths, and flags. In some embodiments, the first stage output 106 may be temporarily stored in a buffer, such as the buffer 404 in the compression module 333, before proceeding to the second stage of compression.

From step 504, the routine 500 proceeds to step 506, where the statistics the LZ symbols and pairs of symbols in the first stage output 106 are calculated. The statistics may be calculated by the statistical analyzer 406 of the compression module 333. According to embodiments, the calculated statistics comprise the frequency of occurrence of each symbol and symbol pair in the first stage output 106, as further shown in FIG. 6. In some embodiments, the frequencies of occurrence of pairs of specific types of symbols may be calculated, such as literal pairs and offset/length pairs. In further embodiments, the frequencies of occurrence of pairs of literal and offset symbols, literal and flag symbols, flag and offset symbols, length and flag symbols, or any combination of these and other pairs of symbols may be calculated.

In further embodiments, frequencies of occurrence may not be calculated for all pairs of the specific types of symbols depending on the total number of symbol pairs possible in order to save memory space and processing time required to calculate and store the statistics. For example, literals stored as ASCII characters may have 256 unique values, and statistics for the 65536 total unique combinations of literal pairs may be calculated and stored, requiring only 64 KB of memory. In contrast, offset and length values may be between 1 and 4096, requiring at least 16 MB of memory to store statistics for each unique combination. Therefore statistics for only a subset of the offset/length pairs, such as [4, 3], [10, 3], [3, 5], and the like, may be calculated and stored by the statistical analyzer 406. Similarly, a subset of literal pairs may be considered for statistics calculation. For example, statistics may be calculated and stored for those literal pairs expected to occur most frequently, based on a-priori analysis or based on statistics collected during earlier time periods.

The routine 500 proceeds from step 506 to step 508, where the specific pairs of LZ symbols in the first stage output 106 to be encoded as single "super symbols" in the final compressed bit string 110 are determined based on the calculated statistics from step 506. This determination may be further performed by the statistical analyzer 406. According to some embodiments, only a subset of the symbol pairs may be encoded as super symbols. For example, only pairs of literal symbols repeating more than a threshold number of times may be treated as a super symbol, with the literals from the remaining pairs treated individually. Offset/length pairs repeating more than a threshold number of times may be treated in a similar fashion. The threshold number of repeated occurrences may be determined from a number of factors, including the number of repeating symbols and symbol pairs, the size of the encoding window in the second stage compression algorithm, the size (maximum number of bits) in the resulting Huffman code table, and the like. The selected threshold number of repeated occurrences may be chosen such that a good tradeoff is achieved between the size of the resulting Huffman code table(s) and the compressibility that can be achieved with the chosen super symbols. In some embodiments, any literal pairs and offset/length pairs occurring twice or more may be treated as a single super symbol for the encoding in the second stage compression.

As shown in FIG. 6, statistics may be calculated for 6 unique literal pairs "AB," "BA," "BC," "BD," "CD," and "DD" from the first stage output 106, but only the literal pair of "AB" (the pair with the highest frequency) may be treated as a super symbol for encoding the final compressed bit string 110. Treating the pair or pairs of symbols with the highest frequency of occurrence as super symbols may provide for the shortest compression output. Next, at step 510, the frequencies of occurrence of the determined super symbols and the remaining individual LZ symbols in the first stage output 106 are recalculated based on the analysis performed in step 508. For example, since the pair of literals "AB" is treated as a super symbol, there is no occurrence of single symbols "A" and "B," and therefore the statistics must be recalculated for building the Huffman code table(s).

From step 510, the routine 500 proceeds to step 512, where a Huffman code table is derived from the recalculated frequencies of occurrence of the LZ symbols and symbol pairs from step 510. For example, as shown in FIG. 6, a Huffman code table may be built from the calculated statistics, with the literal pair "AB" having a frequency of occurrence of 3 out of 9 symbols (0.333) and represented by the bit string "0," the literal "D" having a frequency of occurrence of 3 out of 9 symbols (0.333) and represented by the bit string of "10," the offset/length pair of [4,3] having a frequency of occurrence of 2 out of 9 symbols (0.222) and represented by the bit string "110," and the literal "C" having a frequency of occurrence of 1 out of 9 symbols (0.111) and represented by the bit string of "111." In further embodiments, separate Huffman code tables may be generated for pairs of different types of symbols, such as literal pairs, offset/length pairs, and the like, resulting in separate, mutually exclusive codes for encoding the data into the final compressed bit string 110. For example, there could be one Huffman code table for literal pairs and another mutually exclusive Huffman code table for offset/length pairs, where the two Huffman code tables map the input pairs into mutually exclusive bit strings.

The routine 500 proceeds from step 512 to step 514, where the first stage output 106 is encoded to the final compressed bit string 110 by the stage 2 compressor 408 utilizing Huffman coding and the code table(s) derived from the calculated statistics frequencies of occurrence of the LZ symbols and symbol pairs from step 510. As may be seen in the example shown in FIG. 6, encoding of certain LZ symbol pairs as a single symbol utilizing the embodiments described herein may result in a substantially shorter final compressed bit string 110 compared to the conventional two-stage compression of the same input data 106 as shown in FIG. 1. According to further embodiments, the calculated frequencies of occurrence of the symbols and symbol pairs from step 510 or the code tables(s) derived in step 512 will be stored along with the final compressed bit string on the storage media 310 to provide for decoding and decompression when the data is read by the storage device 300 in response to a subsequent command. From step 514, the routine 500 ends.

According to further embodiments, the routine 500 may be performed without steps 506-510 and instead statistical analysis may be skipped altogether and the Huffman code table(s) for the stage 2 compressor 408 may be derived from predefined statistics collected from test data. Using predefined statistics instead of calculating the symbol and symbol pair statistics in real-time may shorten latency in compression. In some embodiments, the predefined statistics utilized may be based on a type of the input data 102. For example, the controller 320 of a storage device 300 may utilize one set of statistics for image data written to the storage media 310 and another set of statistics for log data.

Based on the foregoing, it will be appreciated that technologies for compressing data for storage or transmission are presented herein. While embodiments are generally described herein in regard to compressing data to be written to the storage media of an SSD, it will be appreciated that the embodiments described in this disclosure may be utilized in any storage device implementing any storage technology where compression of write data is desired. This may include solid-state drives, hybrid magnetic and solid-state drives, magnetic hard disk drives, magnetic tape drives, optical disk drives, USB flash drives, memory cards and cartridges, storage controllers for arrays of flash memory devices, storage controllers for arrays of high-speed magnetic disk drives, and the like. It will further be appreciated that the embodiments described in this disclosure may be utilized to compress data in real time for transmission over a communication channel by a communications receiver or transceiver device. The above-described embodiments are merely possible examples of implementations, set forth for a clear understanding of the principles of the present disclosure.

The logical operations, functions, or steps described herein as part of a method, process or routine may be implemented (1) as a sequence of processor-implemented acts, software modules, or portions of code running on a controller or computing system and/or (2) as interconnected machine logic circuits or circuit modules within the controller or computing system. The implementation is a matter of choice dependent on the performance and other requirements of the system. Alternate implementations are included in which operations, functions or steps may not be included or executed at all, may be executed out of order from that shown or discussed, including substantially concurrently or in reverse order, depending on the functionality involved, as would be understood by those reasonably skilled in the art of the present disclosure.

It will be appreciated that conditional language, including, but not limited to, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more particular embodiments or that one or more particular embodiments necessarily include logic for deciding, with or without user input or prompting, whether these features, elements and/or steps are included or are to be performed in any particular embodiment.

Many variations and modifications may be made to the above-described embodiments without departing substantially from the spirit and principles of the present disclosure. Further, the scope of the present disclosure is intended to cover any and all combinations and sub-combinations of all elements, features, and aspects discussed above. All such modifications and variations are intended to be included within the scope of the present disclosure, and all possible claims to individual aspects or combinations of elements or steps are intended to be supported by the present disclosure.

What is claimed is:

1. A method comprising the steps of:
   compressing input data in a first stage utilizing a first compression algorithm;
   calculating frequencies of occurrence of symbols and symbol pairs in an output from the first stage;
   identifying one or more pairs of symbols in the output to be encoded together as single super symbols in a final compressed bit string based on the calculated frequencies of occurrence of the symbols and symbol pairs in the output; and
   encoding the super symbols representing the identified pairs of symbols and the remaining symbols in the output from the first stage to the final compressed bit string in a second stage utilizing a second compression algorithm.

2. The method of claim 1, wherein identifying the one or more pairs of symbols to be encoded together as single super symbols comprises identifying an adjacent pair of symbols that occurs more than once in the output from the first stage.

3. The method of claim 1, wherein encoding the output from the first stage to the final compressed bit string in the second stage utilizing the second compression algorithm comprises building one or more code tables based on the calculated frequencies of occurrence of the symbols and the symbol pairs.

4. The method of claim 1, wherein the first compression algorithm comprises a Lempel-Ziv algorithm and the second compression algorithm comprises a Huffman coding.

5. The method of claim 4, wherein the first compression algorithm utilizes the Lempel-Ziv-Storer-Szymanski ("LZSS") algorithm.

6. The method of claim 1, wherein the compressing in the first stage and encoding in the second stage are performed in a compression module of a controller of a storage device, the input data representing data to be written to a storage media of the storage device.

7. The method of claim 6, wherein the storage media comprises NAND flash memory.

8. A storage device comprising:
   a storage media; and
   a controller coupled to the storage media and operable to:
   receive data to be written to the storage media,
   compress the data in a first stage utilizing a first compression algorithm,
   calculate statistics regarding frequencies of occurrence of symbols and symbol pairs in an output from the first stage,
   identify one or more pairs of symbols to be encoded together as single super symbols in a final compressed bit string in a second stage based on the calculated statistics regarding the frequencies of occurrence of the symbols and symbol pairs, and
   encode the super symbols representing the identified pairs of symbols to be encoded together and the remaining symbols into the final compressed bit string in the second stage utilizing a second compression algorithm that differs from the first compression algorithm.

9. The storage device of claim 8, wherein the first compression algorithm comprises a Lempel-Ziv algorithm and the second compression algorithm comprises a Huffman coding.

10. The storage device of claim 9, wherein the first compression algorithm utilizes the Lempel-Ziv-Storer-Szymanski ("LZSS") algorithm.

11. The storage device of claim 8, wherein the controller is further operable to, upon identifying the one or more pairs of symbols to be encoded together as single super symbols, recalculate the statistics regarding the frequencies of occurrence of the symbols and symbol pairs in the output from the first stage based on the identified one or more pairs of symbols to be encoded together as single super symbols.

12. The storage device of claim 8, wherein identifying the one or more pairs of symbols to be encoded as single super symbols comprises identifying an adjacent pair of symbols that occurs more than once in the output from the first stage.

13. The storage device of claim 8, wherein encoding the super symbols representing the identified pairs of symbols to be encoded together and the remaining symbols into the final compressed bit string in the second stage comprises building one or more code tables based on the calculated statistics regarding the frequencies of occurrence of the symbols and the symbol pairs.

14. The storage device of claim 8, wherein the storage media comprises NAND flash memory.

15. A non-transitory computer readable medium comprising processor-executable instructions that, when executed by a CPU of a controller of a storage device, cause the controller to compress data for storage in the storage device by:
   compress the data in a first stage utilizing a first compression algorithm;
   calculate statistics regarding frequencies of occurrence of symbols and symbol pairs in an output from the first stage;
   identify one or more pairs of symbols to be encoded together as single super symbols in a final compressed bit string in a second stage based on the calculated statistics regarding the frequencies of occurrence of the symbols and symbol pairs in the output, the final compressed bit string to be written to a storage media of the storage device; and
   encode the identified super symbols and the remaining symbols into the final compressed bit string in the second stage utilizing a second compression algorithm.

16. The non-transitory computer readable medium of claim 15, wherein the first compression algorithm comprises the Lempel-Ziv-Storer-Szymanski ("LZSS") algorithm.

17. The non-transitory computer readable medium of claim 15, wherein the second compression algorithm comprises a Huffman coding.

18. The non-transitory computer readable medium of claim 15, wherein encoding the identified super symbols and the remaining symbols into the final compressed bit string in the second stage comprises building a plurality of code tables based on the calculated statistics regarding the frequencies of occurrence of the symbols and the symbol pairs, each of the plurality of code tables built for a different type of symbols or symbol pairs and containing mutually exclusive codes from the other of the plurality of code tables.

\* \* \* \* \*